United States Patent
Wang et al.

(10) Patent No.: US 8,210,699 B2
(45) Date of Patent: Jul. 3, 2012

(54) WAVELENGTH CONVERTING SYSTEM

(75) Inventors: Chien-Yuan Wang, Hsinchu (TW); Min-Hsun Hsieh, Hsinchu (TW); Chih-Chiang Lu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/195,620

(22) Filed: Aug. 1, 2011

(65) Prior Publication Data

US 2011/0286201 A1 Nov. 24, 2011

Related U.S. Application Data

(63) Continuation of application No. 12/941,697, filed on Nov. 8, 2010, now Pat. No. 7,988,325, which is a continuation of application No. 12/219,084, filed on Jul. 16, 2008, now Pat. No. 7,850,321.

(30) Foreign Application Priority Data

Jul. 18, 2007 (TW) ............................. 96126269 A (51) Int. Cl.
*F21V 9/16* (2006.01)
(52) U.S. Cl. ......................................... 362/84; 362/231
(58) Field of Classification Search .................. 362/84, 362/231, 235, 260
See application file for complete search history.

(56) References Cited

U.S. PATENT DOCUMENTS

| 7,038,370 | B2 | 5/2006 | Mueller-Mach et al. |
| 7,922,352 | B2* | 4/2011 | Chua et al. ................ 362/231 |
| 2005/0099808 | A1 | 5/2005 | Cheng et al. |
| 2008/0151527 | A1 | 6/2008 | Ueno et al. |
| 2008/0165523 | A1 | 7/2008 | Schmidt et al. |
| 2008/0308822 | A1 | 12/2008 | Tsang et al. |
| 2009/0180273 | A1 | 7/2009 | Kim et al. |
| 2011/0220929 | A1* | 9/2011 | Collins et al. ................ 257/98 |

FOREIGN PATENT DOCUMENTS

CN 1761835 A 4/2006

* cited by examiner

*Primary Examiner* — David V Bruce
(74) *Attorney, Agent, or Firm* — Muncy, Geissler, Olds & Lowe, PLLC (57) ABSTRACT

An embodiment of the invention discloses a wavelength converting system. The wavelength converting system comprises: a wavelength converter having a first area and a second area; a first light source disposed under the first area and inducing a first mixed light being visible above the first area; a second light source disposed under the second area and inducing a second mixed light being visible above the second area; and a carrier supporting the first light source and the second light source. The first light source and the second light source have a dominant wavelength difference of 1 nm~20 nm, and the first mixed light and the second mixed light have a color temperature difference less than 100K.

20 Claims, 7 Drawing Sheets

WAVELENGTH CONVERTING SYSTEM

REFERENCE TO RELATED APPLICATION

This application is a continuation application of U.S. patent application Ser. No. 12/941,697, entitled "Wavelength converting system", filed on Nov. 8, 2010 now U.S. Pat. No. 7,988,325, which is a continuation of U.S. patent application Ser. No. 12/219,084, entitled "Wavelength converting system", filed on Jul. 16, 2008 now U.S. Pat. No. 7,850,321 for which priority is claimed under 35 U.S.C. §120; and this application claims priority of Application No. 096126269 filed in Taiwan on Jul. 18, 2007 under 35 U.S.C. §119, the entire contents of all of which are hereby incorporated by reference.

TECHNICAL FIELD

The invention relates to a wavelength converting system and more particularly to a wavelength converting system capable of generating a wavelength spectrum having a stable color temperature in response to a change of the excitation wavelength.

DESCRIPTION OF BACKGROUND ART

Light-emitting diode (LED) is known by its high energy efficiency and so introduced to the energy-saving movement in many kinds of equipments of variable fields including outdoor lighting, means of transportation, and household lighting, such as street light, traffic light, outdoor display, headlamp, trail light, center high mounted stop lamps (CHMSL), and decoration light.

A basic structure of a light-emitting diode chip mainly includes a p-n junction. The hole of the p-type semiconductor material and the electron of the n-type semiconductor recombine to emit light under a bias voltage. The light-emitting area in the structure is sometimes called "active layer" or "light-emitting layer". The wavelength from the light-emitting layer is determined by the adopted material. The structure emitting red light is constructed by introducing a main material such as GaP, GaAsP, AlGaAs, and AlGaInP. The structure emitting green light is constructed by introducing a main material such GaP and ZnCdSe. The structure emitting blue light is constructed by introducing a main material such as SiC and GaN. Those different materials are usually grown on different substrates such as GaP, GaAs, SiC, and sapphire.

The available light-emitting diode chip in market emits not only white light but also variable color lights of almost the whole range of the visible wavelength (400 nm~750 nm) and ultraviolet. White light can be generated in several ways such as by mixing lights from blue, green, and red chips, exciting phosphor by UV light, exciting phosphor by blue light, using semiconductor wavelength converting material (also called "photo-recycling semiconductor LED"; PRS LED), and dye. The most common commercial way of generating white light makes yttrium aluminum garnet (YAG) phosphor be pumped by blue light to generate a complementary color. For example, a 460 nm blue chip is introduced to excite YAG:Ce phosphor to generate a 570 nm around yellow light, one may control the concentration and the thickness of the phosphor to adjust the ratio of blue light to yellow light in order to produce white lights having various color temperatures.

Phosphor absorbs shorter wavelengths to emit longer wavelengths, that is, absorbs a high energy level radiation to emit a low energy level radiation. A phosphor is characterized by its excitation band and emission band. The excitation band has a primary wavelength distribution shorter than that of the emission band, while the two bands may overlap in part. The peak wavelength difference of the absorption band and the emission wavelength is called "Stokes shift". The phosphor may be caused to radiate in a similar emission spectrum by any wavelength within the excitation band. However, the phosphor is operated at different efficiencies responsive to different absorbed wavelengths, which depends on the composition of phosphor.

In another aspect, the numerous chips on a wafer appear to be in a non-uniform wavelength distribution spanning from 10 nm to 20 nm or more. Provided a specific recipe of phosphor is introduced to directly or indirectly overlay on or be packaged with all chips, the color temperature of the white light from the end product is divergent so significantly that the qualitative uniformity of the application product is affected.

Figure 1A:
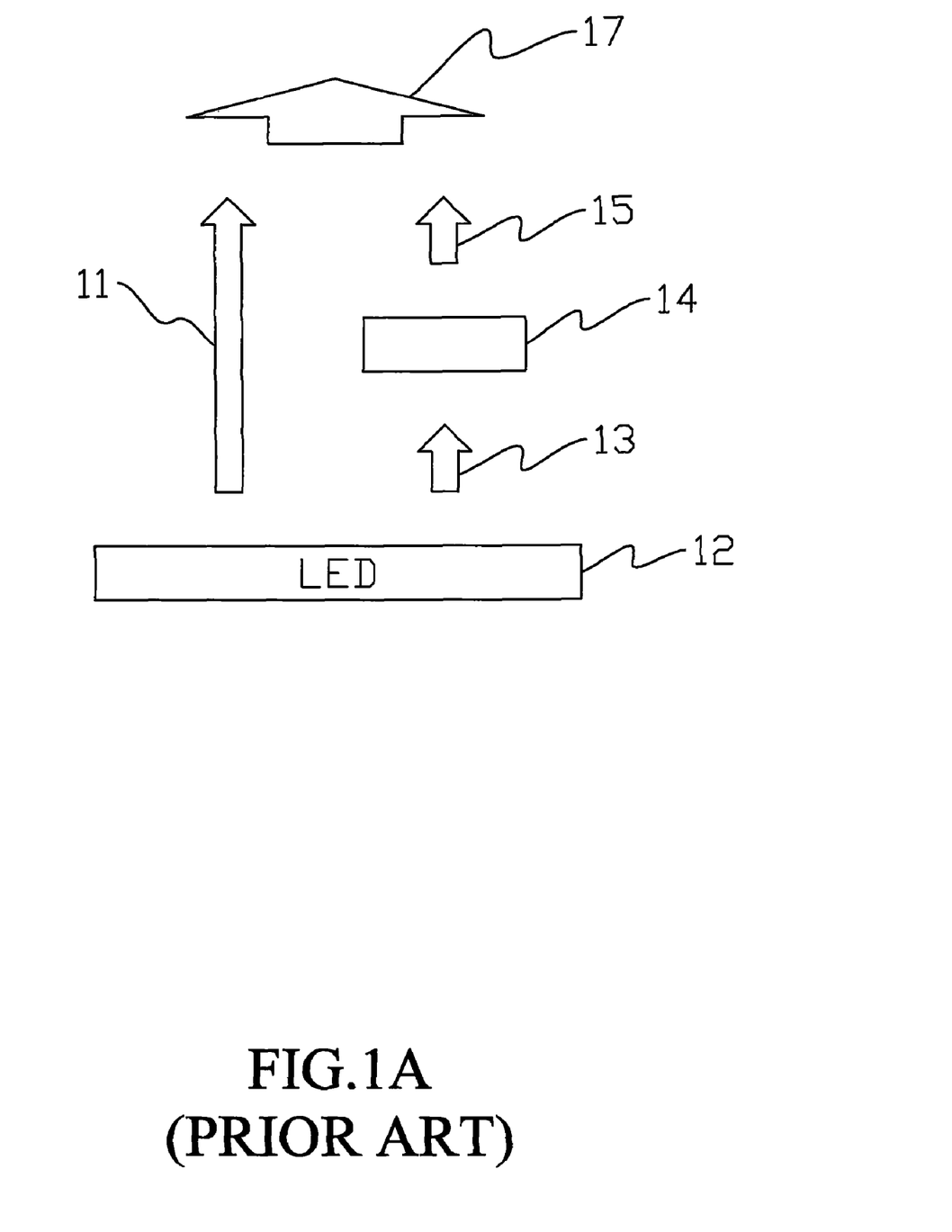
FIGS. 1A and 1B illustrate a conventional wavelength converting system and its CIE chromaticity diagram.

As shown in FIG. 1A, LED light source 12 emits blue lights 11 and 13 at specific wavelengths. The blue light 13 excites phosphor 14 to generate yellow light 15. The blue light 11 and the yellow light 15 are mixed into white light 17. The yellow light 15 is going to remain in the same spectrum even if the wavelength of the blue light from the LED light source 12 is changed but still within the excitation band of the phosphor 14. The wavelength difference of the blue light therefore results in a shift of the color temperature of the mixed white light 17.

Figure 1B:
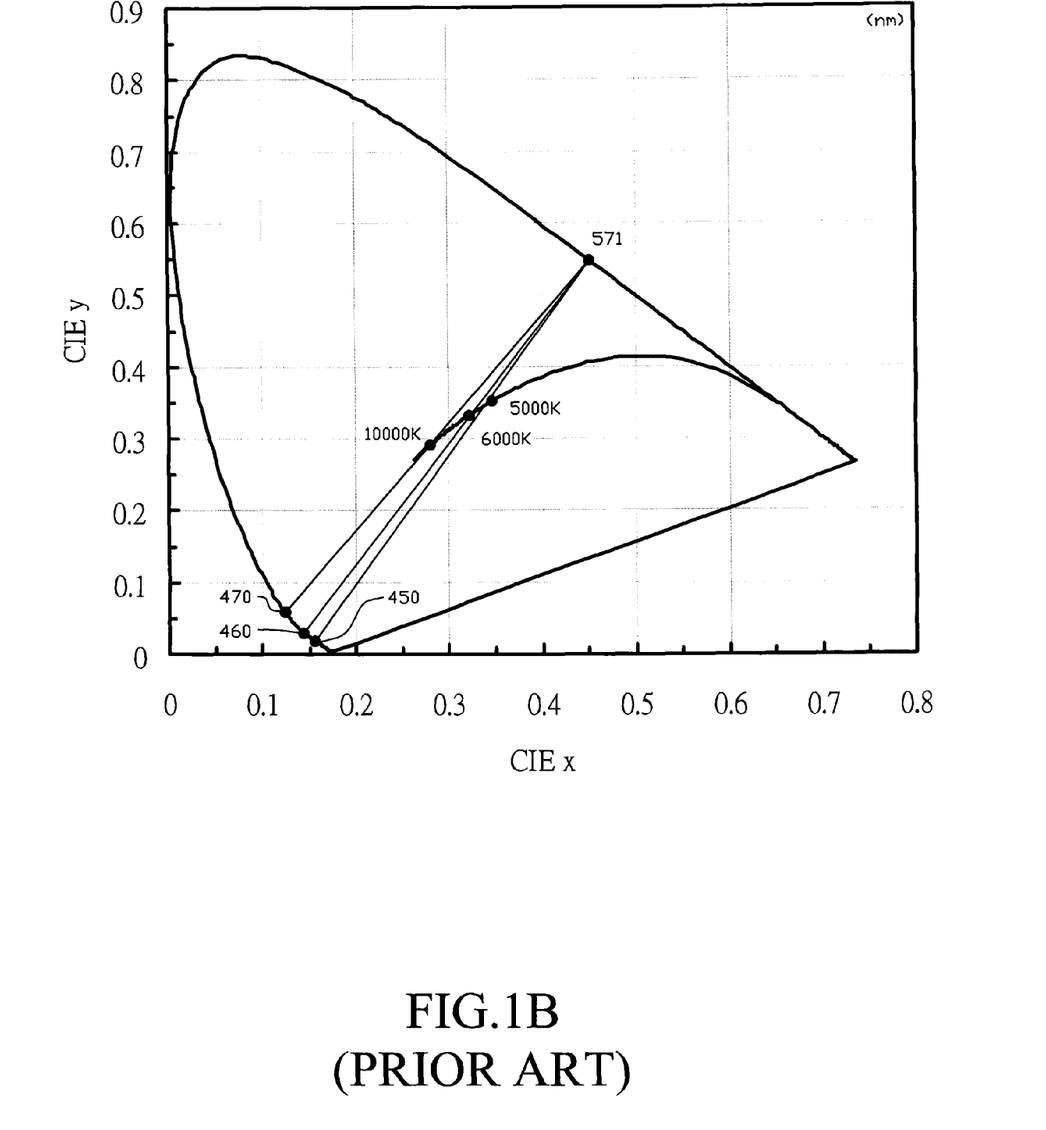

In addition, a CIE chromaticity diagram is shown in FIG. 1B. A 460 nm blue light and a 571 nm yellow light generated by exciting YAG phosphor at a fixed condition are mixed into a white light of about 6000K color temperature. However, if the blue light wavelength shifts up to 470 nm or down to 450 nm, while the yellow light is unchanged, the color temperature of the mixed white light also shifts to 10000K or 5000K, which is usually unacceptable to common applications. To produce color lights having constant color temperatures, therefore, the chips are necessarily undergone sorting and binning processes before a condition- or characteristic-specific phosphor is applied to.

SUMMARY OF THE DISCLOSURE

A wavelength converting system in accordance with one embodiment of present comprises: a wavelength converter having a first area and a second area; a first light source disposed under the first area and inducing a first mixed light being visible above the first area; a second light source disposed under the second area and inducing a second mixed light being visible above the second area; and a carrier supporting the first light source and the second light source. The first light source and the second light source have a dominant wavelength difference of 1 nm-20 nm, and the first mixed light and the second mixed light have a color temperature difference less than 100K.

A wavelength converting system in accordance with one embodiment of present invention comprises a first light-emitting diode chip, driven on a first current, having a first area and a first dominant wavelength; a second light-emitting diode chip, driven on a second current, having a second area and a second dominant wavelength different from the first dominant wavelength; a wavelength converter disposed on the first light-emitting diode chip and the second light-emitting diode chip; and a mixed light, induced by the first light-emitting diode chip and the second light-emitting diode chip, being visible above the wavelength converter. The first current and the second current are configured to oppositely change in a range, and the mixed light has a color temperature variation less than 100K within the range.

A wavelength converting system in accordance with one embodiment of present invention comprises a plurality of light-emitting structures having a dominant wavelength distribution spanned in few nanometers or tens of nanometers; a trench formed between two of the plurality of the light-emitting structures; and a wavelength converter disposed on the plurality of light-emitting structures and the trench.

DETAILED DESCRIPTION OF PREFERRED EMBODIMENTS

The embodiments are described hereinafter in accompany with drawings.

Figure 2A:
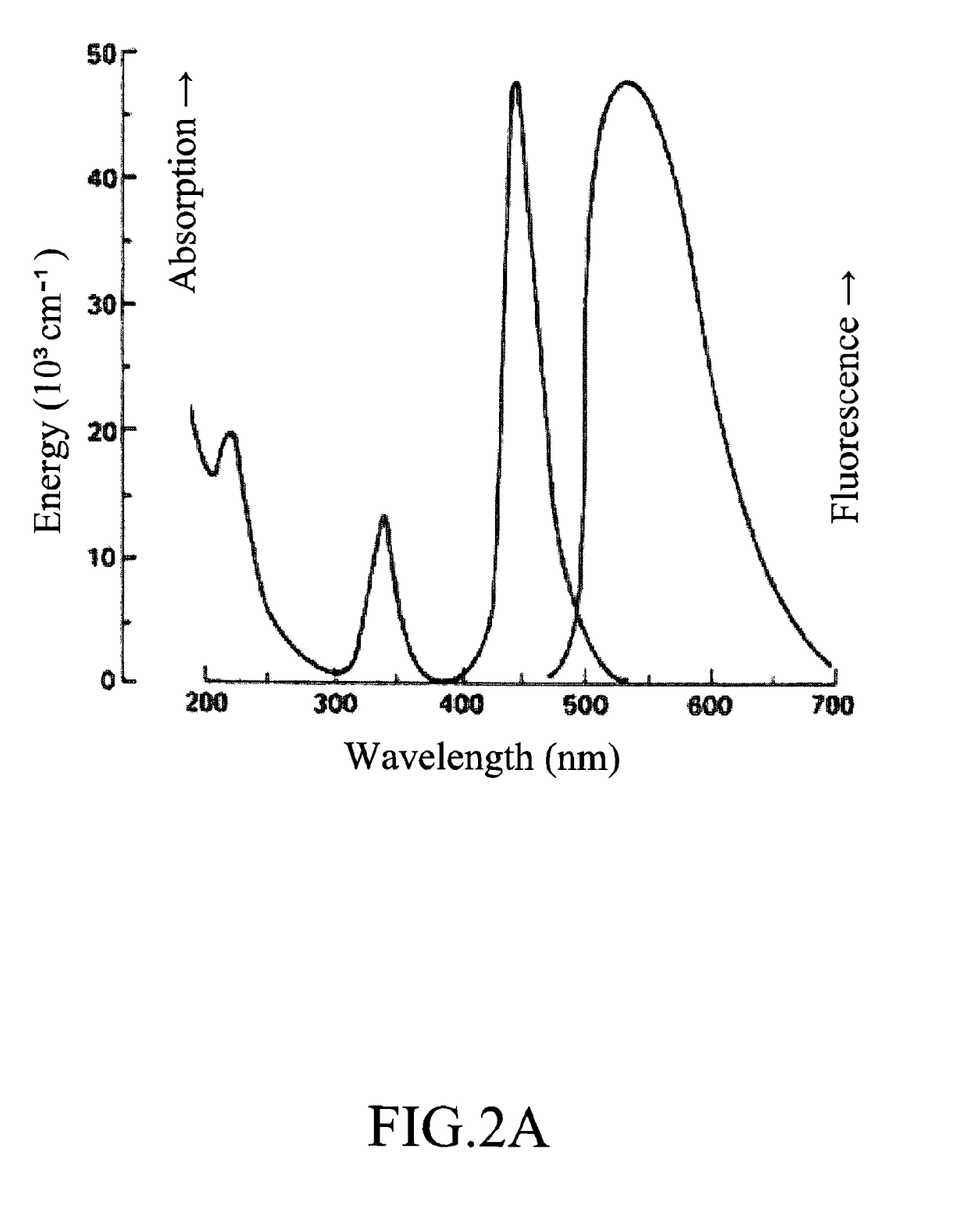
FIG. 2A illustrates an excitation and emission spectrum of a YAG phosphor in accordance with an embodiment of present invention.
Figure 2B:
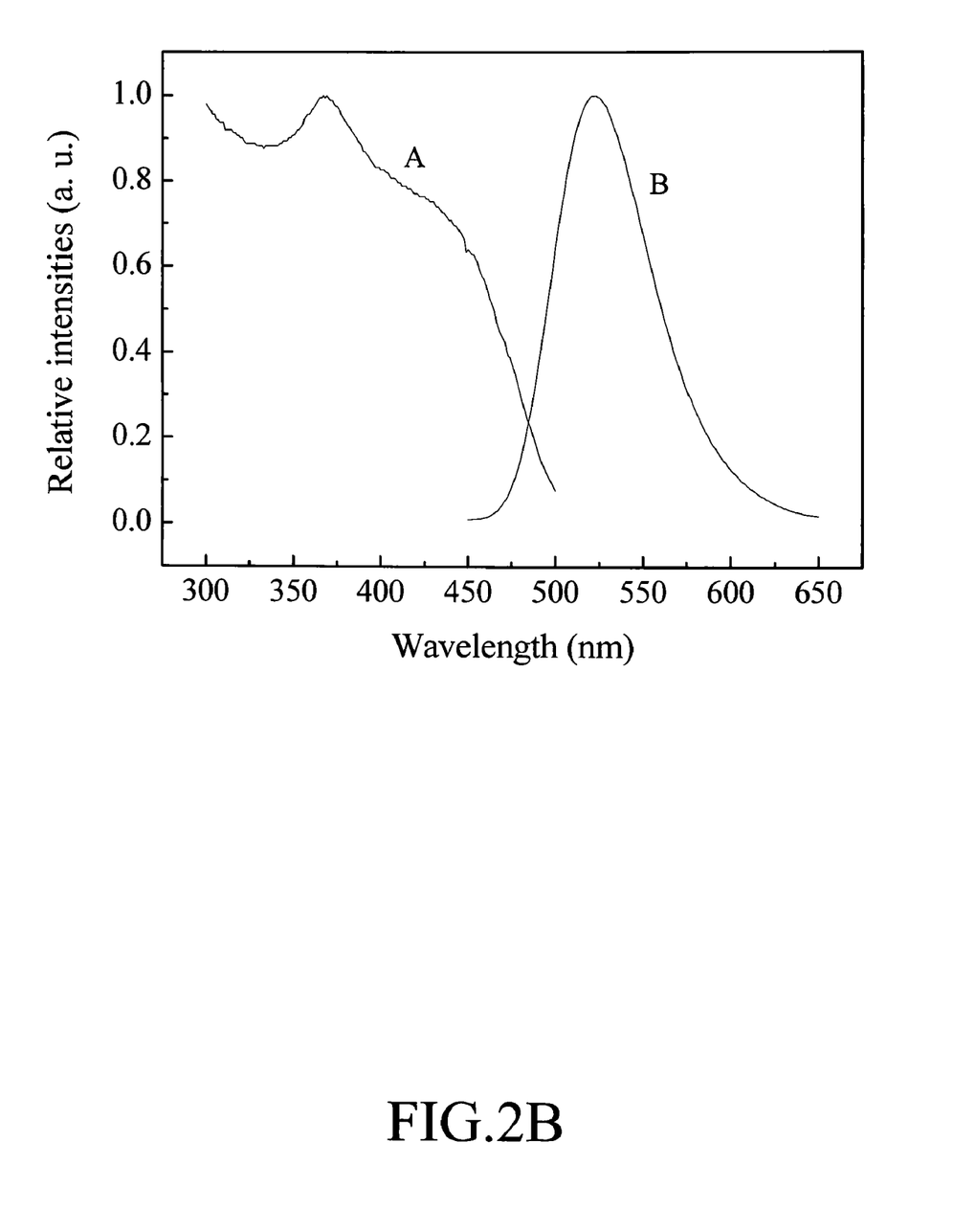
FIG. 2B illustrates an excitation and emission spectrum of a silicate phosphor in accordance with an embodiment of present invention.

In one embodiment of present invention, YAG and silicate-based phosphors are selected to blend into a mixed phosphor (hereinafter called "mixture", but the kinds and the quantities of materials are not limited by the aforementioned.) In the embodiment, FIG. 2A illustrates the spectrum of YAG phosphor, which has an excitation spectrum of a range of 200 nm~530 nm, a principle emission spectrum of a range of 480 nm~700 nm, and a peak wavelength of about 530 nm. FIG. 2B illustrates the spectrum of the silicate-based phosphor, which has an excitation spectrum in a range of 300 nm~500 nm, a principle emission spectrum of a range of 470 nm~650 nm, and a peak wavelength of about 525 nm.

As shown in FIGS. 2A and 2B, YAG phosphor has a higher efficiency at about 470 nm, while silicate-based phosphor has a higher efficiency at about 450 nm. When the excitation wavelength moving from 470 nm to 450 nm, the efficiency of YAG phosphor decreases, while the efficiency of silicate-based phosphor increases. In other words, provided the two phosphors are mixed and excited at a wavelength starting from 470 nm to 450 nm, the ratio of the shorter wavelength fluorescent light contributed by silicate-based phosphor to the total fluorescent light increases, while the ratio of the longer wavelength fluorescent light contributed by YAG phosphor to the total fluorescent light decreases. In consequence, the ratio of the emission lights from YAG and silicate-based phosphors changes with the variation of the excitation. In the embodiment, when the excitation wavelength decreasing, the wavelength spectrum of the mixed light from the mixture is slanted to the direction of the shorter wavelength, i.e. the shorter wavelength is given a higher weighting in the mixed light. The color temperature of the color light resulting from mixing the emission light of the mixture and the excitation light is kept in a constant range. On the contrary, when the excitation wavelength moving from the shorter wavelength to the longer wavelength, the fluorescent mixture according to the embodiment is able to provide an emission light shifting to longer wavelength. By means of the mixture according to the embodiment, a positive correlation is found between the emission wavelength and the excitation wavelength.

Figure 2C:
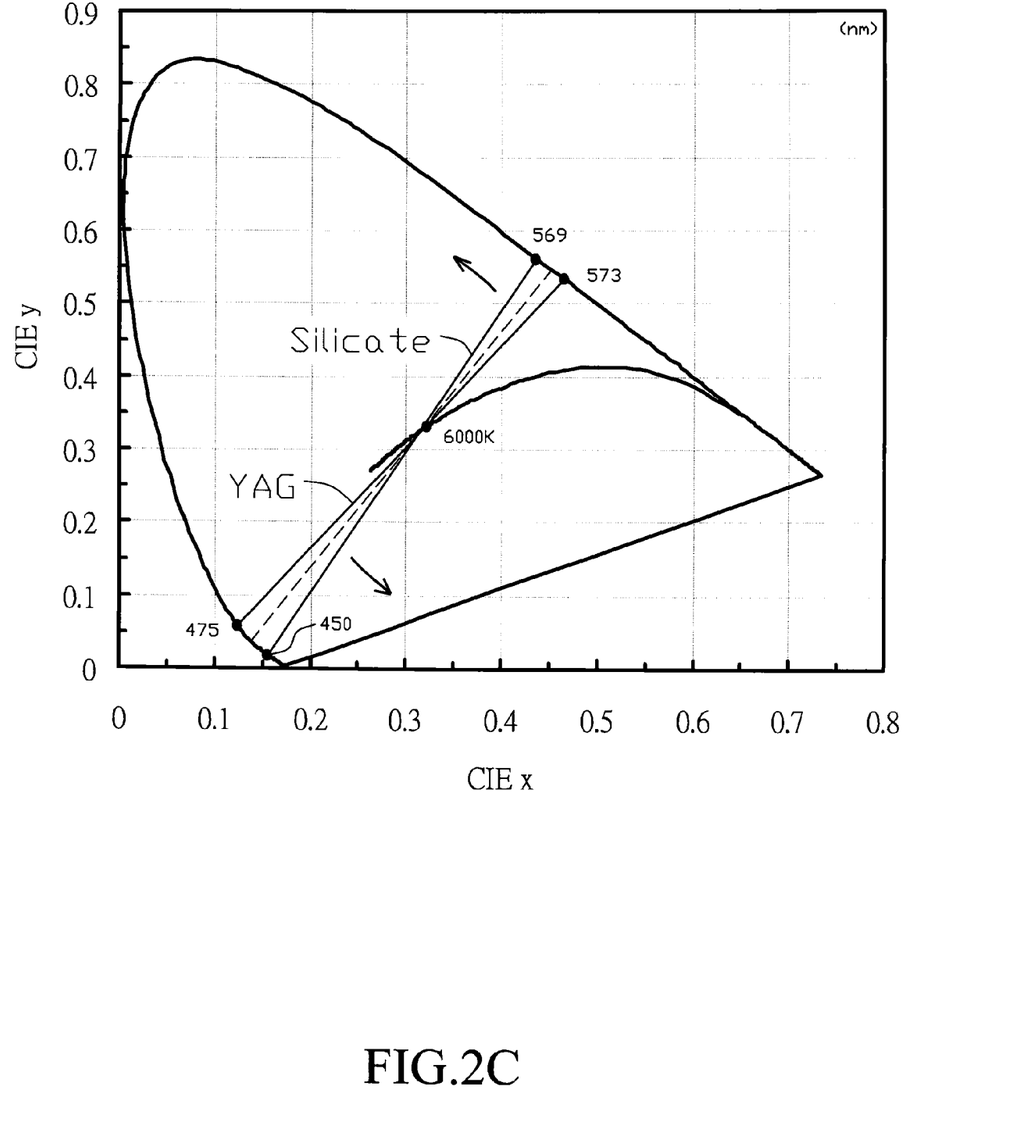
FIG. 2C illustrates a CIE chromaticity diagram of a wavelength converting system in accordance with an embodiment of present invention.

FIG. 2C shows a CIE chromaticity diagram illustrating the relationship between the excitation light and the emission light or wavelength converting system in accordance with one embodiment of the invention. The lines respectively connecting the representative excitation wavelength and the representative emission wavelength of one and the other phosphor of the mixture, or any two kinds of phosphors, are intersected in the diagram. The arc of the lower left sector of the intersection represents the wavelength range of the excitation light. The arc of the upper right sector of the intersection represents the wavelength range of the emission light from the excited phosphor. The chromaticity coordinates of the color light mixed by the emission light and the unconverted excitation light locates on or nearby the intersection on the CIE diagram. The color temperature resulted from the wavelength converting system can be restricted on the vicinity of the line intersection by a well modification of the distribution of the excitation wavelength and the phosphor ratio of the mixture. Therefore, the color light generated by the system can be kept on a relative stable color temperature. Specifically, applying the fluorescent mixture according the embodiment to blue LED chips having divergent wavelengths or spectra, one can obtains white lights with less variation by mixing the yellow light generated by exciting the mixture by the light from those chips and the raw blue light from the same.

In the diagram, the line connecting 450 nm and 569 nm illustrates the possible color light from the pure silicate-based phosphor, and the line connecting 470 nm and 573 nm illustrates the possible color light from the pure YAG phosphor. The two lines intersect at the point of the white light of around 6000 K. With a specific mixture ratio and arrangement of YAG and silicate-based phosphors, the emission light having a dominant wavelength of 569 nm~573 nm can be generated by the excitation light ranging between 450 nm and 470 nm, and mixed with the same to emit white light having a substantially constant color temperature around 6000 K.

Figure 3:
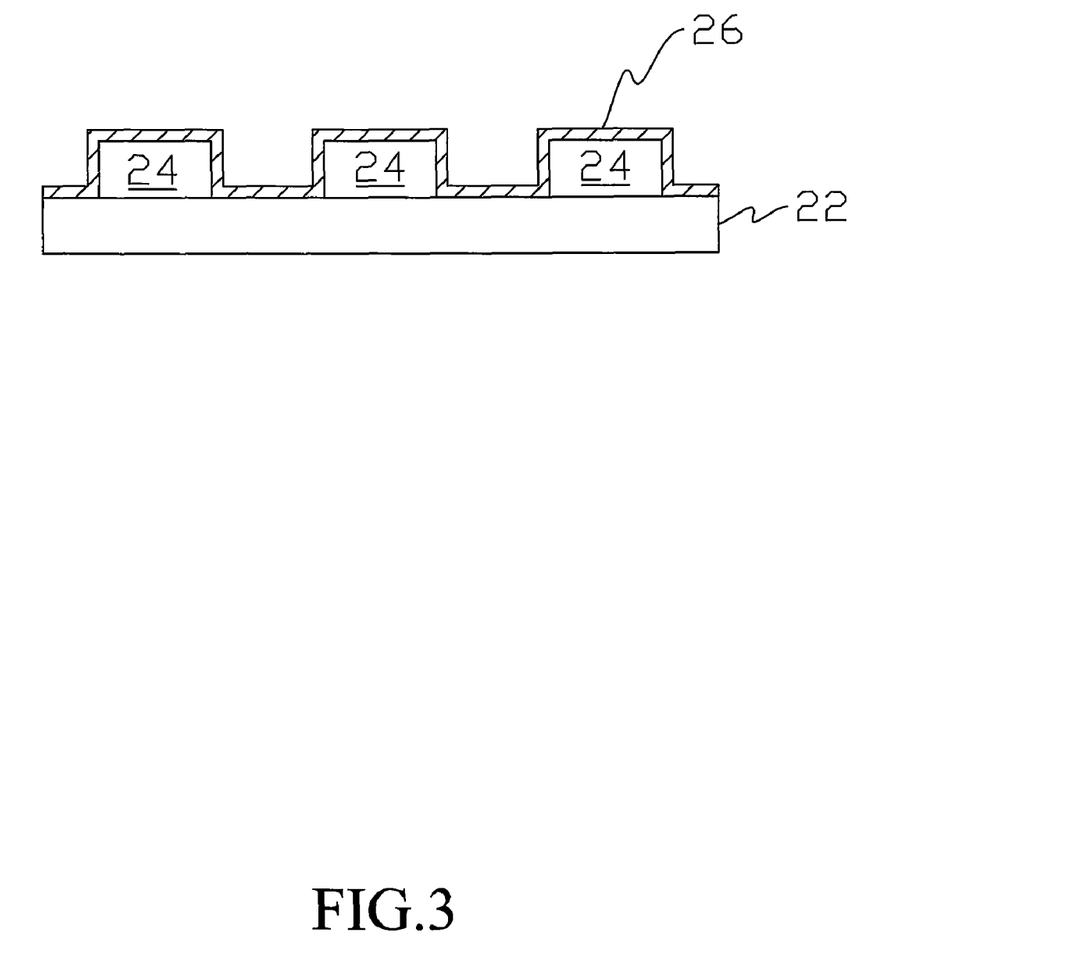
FIG. 3 illustrates a wavelength converting system in accordance with another embodiment of present invention.

As shown in FIG. 3, another embodiment of the invention discloses a carrier 22, light-emitting structures 24, and a phosphor 26 overlaying on the light-emitting structures 24, wherein the quantity of the light-emitting structures is illustrative and not used to limit the disclosure of the embodiment. The carrier 22 includes but not limited to a growth substrate and a material or a structure applicable to dispose the light-emitting structures 24. The wavelength of the light-emitting structures 24 varies in a range of few nanometers, tens of nanometers, or applicable to the phosphor 26, for example, 10 nm~20 nm. The dominant wavelength of the light-emitting structure 24 is within the visible light spectrum such as 420 nm~480 nm, or the wavelength viable to excite the phosphor 26. The light-emitting structures 24 on the carrier 22 can emit light in a wavelength distribution of Gaussian distribution or non-normal distribution. The wavelength of the emission light of the phosphor 26 moves in a tendency following the change of the wavelength of the excitation light. Even the light-emitting structures 24 have excitation wavelengths different from each other; the emission wavelength from the phosphor 26 on the light-emitting structure 24 may be spontaneously adjusted by following or tracing the shifting tendency of the excitation wavelength, or according to the alteration of the excitation wavelength. Accordingly, the impact, caused by the quality deviation such as the variation of the wavelength of the light-emitting structure 24, on the color difference of the mixed light or the perceived color light quality can be reduced. For example, using the phosphor 26 of present embodiment, the color temperature of the color light mixed by the excitation light of the light-emitting structure 24 and the emission light of the phosphor 26 can be kept in a fixed range. The range is determined by the kinds of phosphors, the user's requiring specification, and/or the application environment.

In the drawings, the arrangement of overlaying the phosphor 26 is only an illustration of the embodiment. Any kinds of methods can apparently be used to dispose the phosphor 26 on the light-emitting structure 24, such as partial coverage, uniform thickness, varying thickness, upper side coverage, and lateral direction coverage. In one case, the light-emitting structure 24 is grown on a growth substrate and covered by the phosphor 26. In another case, the light-emitting structure 24 is separated from a growth substrate, mounted on the carrier 22, and then covered by the phosphor 26. Taiwan granted patent No. 1241728 and U.S. patent application Ser. No. 11/160,588 owned by the same applicant are hereby incorporated by reference. In further case, the light-emitting structure 24 is a light-emitting diode chip or package, and the carrier 22 is a circuit board. In addition, the light-emitting structure 24 can be arranged on the carrier 22 in a flip-chip arrangement and then covered by the phosphor 26. In a preferable case, the phosphor 26 overlays on a light-pervious substrate or a light-pervious optical element. The light-emitting structure 24 preferably emits light in a range of 400 nm-500 nm. The color light mixed by the excitation light of the light-emitting structure 24 and the emission light of the phosphor 26 includes but not limited to white light and other visible light.

Figure 4:
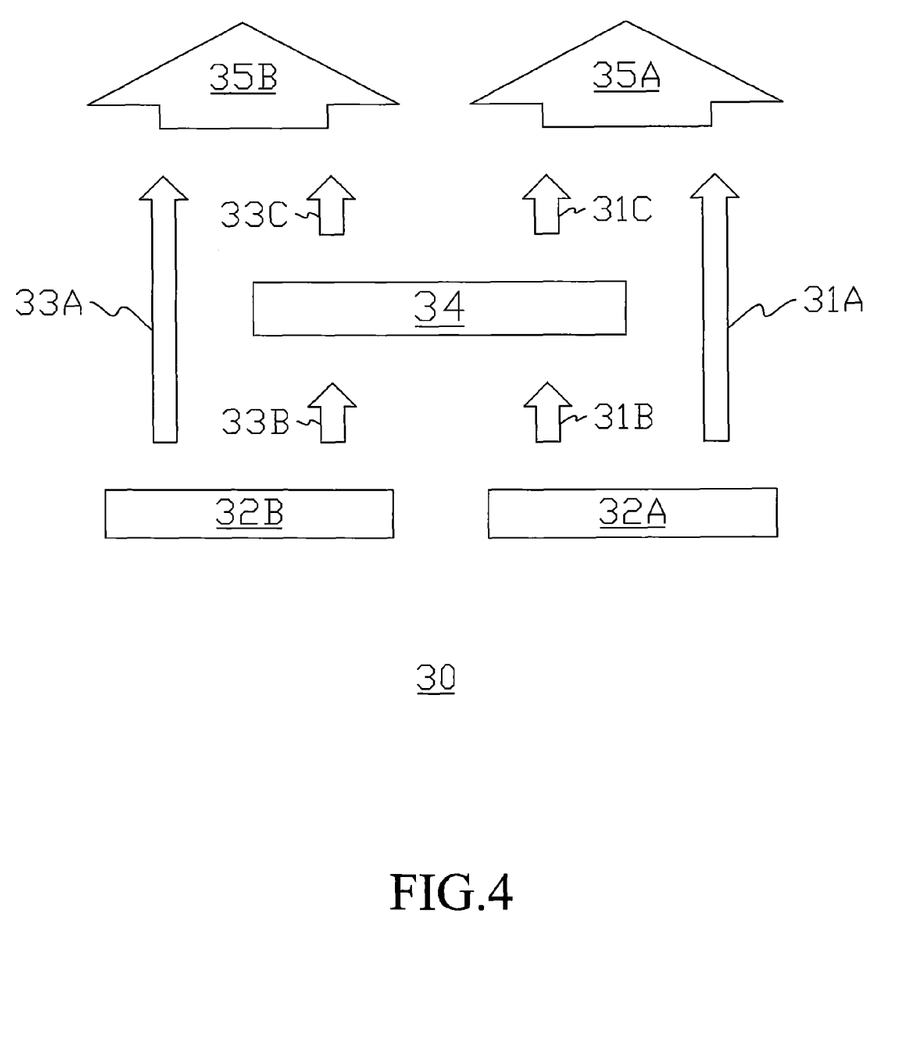
FIG. 4 illustrates a wavelength converting system in accordance with further embodiment of present invention.

As shown in FIG. 4, in accordance with another embodiment of the invention, a wavelength converting system 30 includes a first light source 32A, a second light source 32B, and a wavelength converter 34. The first light source 32A and the second light source 32B are able to emit light rays which show perceivable difference in wavelength, spectrum, or intensity. For example, the perceivable difference is a wavelength difference or spectrum shift in a range of 1 nm~20 nm or so. The wavelength converter 34 includes at least one material having a composition able to be excited by the first light source 32A and the second light source 32B, and emitting light in response to a changing tendency of the excitation light in a specific spectrum, or in a positive correlation with the excitation light.

The wavelength converter 34 is excited by light 31B from the first light source 32A to generate emission light 31C. The unconverted light 31A from the first light source 32A and the light 31B are mixed to mixed light 35A. The wavelength converter 34 is excited by light 33B from the second light source 32B to generate emission light 33C. The unconverted light 33A from the second light source 32B and the light 33C are mixed to mixed light 35B. The mixed lights 35A and 35B have similar color temperature, for example, the mixed lights 35A and 35B have a color temperature difference less than 100K, or a number below that an user is not easily aware of such difference, or similar chromaticity coordinates. Using the wavelength converter 34 in accordance with present embodiment, the system 30 can generate uniform or similar color lights, such as the mixed lights 35A and 35B, even though there exists a perceivable wavelength difference between light sources such as light sources 32A and 32B.

In present embodiment, the wavelength converter 34 may directly contact with the light sources 32A and 32B, for example, a package, including more light-emitting diode chips, is packaged by a material having a fluorescent mixture showing a positive correlation between the excitation wavelength and the emission wavelength. The wavelength converter 34 may also be separated from the light sources 32A and 32B, for example, a luminous device includes more light sources and a light-pervious optical element which is a kind of covering means such as a lampshade, a tube, a lens, a cover, a sticker, a plate, and a film, and covered by, coupled to, or mixed with the wavelength converter 34 positioned on the light path of the light source and used to convert the original wavelength of the light source. In addition, the wavelength converter 34 can be optionally formed on a reflective inner surface of the luminous device, and used to convert the light coming from the light source and then reflected by the inner surface, or being reflected to transmit the wavelength converter 34.

Table 1 shows an experimental result obtained by implementing an embodiment of the invention. Two 15 mil×15 mil nitride-series light-emitting diode chips are operated under controllable current and positioned adjacent to each other in a package equipped with a silver reflector. Among the two chips, one has a dominant wavelength of 450 nm, and the other one has a dominant wavelength of 470 nm. The silicate-based phosphor and YAG phosphor in a weight ratio of about 1.08 (0.26 g/0.24 g) are mixed with epoxy and disposed on the two light-emitting diode chips. The input currents to the respective two light-emitting diode chips are controlled to oppositely change in a range between 0 mA~20 mA, i.e. the current inputted into one chip arises while the current inputted into the other chip drops. The wavelength spectrum of the mixed light resulted from the two chips can be changed by adjusting the currents into the chips. The configuration of the experiment is used to simulate the wavelength distribution of blue light ranged in 450 nm~470 nm. In one experimental case, the input current is set to levels of 0 mA, 5 mA, 10 mA, 15 mA, and 20 mA. One can observe that the correlated color temperature (CCT) of the resulted mixed light can be kept within 5945K~6035K, wherein the difference is less than 100K, even though the input currents of the two chips change. In other words, the fluorescent mixture in accordance with the embodiment of the invention has a higher tolerance to the difference of the intensity and the wavelength of the light sources such that the system can achieve a relative steady luminous quality.

Using the wavelength converter in accordance with an embodiment of the invention, a user can have an opportunity to freely adopt any one chip from a single wafer. In other words, even there exists an emitting wavelength difference between the light-emitting diode chips on the single wafer, those chips, provided well functioning, can potentially be used in downstream products without further binning and sorting. Furthermore, using the wavelength converter in accordance with an embodiment of the invention, even though the light sources arranged in the wavelength converting system have divergent wavelength distributions, the color temperature resulted from the system is only slightly influenced by those property-divergent light sources.

Besides YAG and silicate-based phosphors adoptable in the embodiment of the invention, the material of the phosphor excitable to emit yellow light includes but not limited to Terbium Aluminum Garnet (TAG) which has an exemplary composition of $Tb_3Al_5O_{12}$:Ce and oxynitride which has an exemplary composition of $(SrBa)Si_2N_2O_2$:Eu.

The foregoing description has been directed to the specific embodiments of this invention. It will be apparent; however, that other variations and modifications may be made to the embodiments without escaping the spirit and scope of the invention.

TABLE 1

| Silicate/YAG = 0.26/0.24(g/g) | | | | | | |
|---|---|---|---|---|---|---|
| If(mA) | | | | | | |
| 450 (nm) | 470 (nm) | P (mW) | Iv (lm) | CIEx | CIEy | CCT (K) |
| 0 | 20 | 9.531 | 3.161 | 0.3176 | 0.3875 | 6023 |
| 5 | 15 | 10.200 | 3.388 | 0.3182 | 0.3755 | 6035 |
| 10 | 10 | 10.500 | 3.472 | 0.3192 | 0.3659 | 6021 |
| 15 | 5 | 10.400 | 3.425 | 0.3201 | 0.3556 | 6018 |
| 20 | 0 | 9.729 | 3.220 | 0.3226 | 0.3431 | 5945 |

What is claimed is:

1. A wavelength converting system, comprising:
   a wavelength converter having a first area and a second area, and capable of generating at least two peak wavelengths in one color;
   a first light source disposed under the first area and inducing a first mixed light being visible above the first area; and
   a second light source disposed under the second area and inducing a second mixed light being visible above the second area; and
   wherein the first light source and the second light source have a dominant wavelength difference of 1 nm~20 nm.

2. The wavelength converting system of claim 1, further comprising a light-pervious optical element covering the first light source and the second light source, and being covered by, coupled to, or mixed with the wavelength converter.

3. The wavelength converting system of claim 2, wherein the light-pervious optical element is selected from the group consisting of a lampshade, a tube, a lens, a cover, a sticker, a plate, and a film.

4. The wavelength converting system of claim 1, wherein the wavelength converter is separated from the first light source and the second light source.

5. The wavelength converting system of claim 1, wherein the wavelength converter is configured to directly contact with the first light source and the second light source.

6. The wavelength converting system of claim 1, wherein the wavelength converter comprises a fluorescent mixture showing a positive correlation between an excitation wavelength and an emission wavelength.

7. The wavelength converting system of claim 1, further comprising a carrier on which the first light source and the second light source are flip-chip mounted.

8. The wavelength converting system of claim 1, wherein each of the first light source and the second light source comprises a light-pervious substrate or a light-pervious optical element.

9. The wavelength converting system of claim 8, wherein the wavelength converter is disposed on the light-pervious substrate or the light-pervious optical element.

10. The wavelength converting system of claim 1, wherein the wavelength converter is capable of generating at least two peak wavelengths in yellow color.

11. The wavelength converting system of claim 1, wherein the first mixed light and the second mixed light have a color temperature difference less than 100K.

12. The wavelength converting system of claim 1, wherein the wavelength converter comprises at least two phosphors.

13. The wavelength converting system of claim 1, wherein the wavelength converter comprises a YAG phosphor.

14. The wavelength converting system of claim 1, wherein the wavelength converter comprises a silicate-based phosphor.

15. The wavelength converting system of claim 1, when being driven, the first light source and the second light source have different current densities.

16. The wavelength converting system of claim 1, further comprising a trench between the first light source and the second light source.

17. The wavelength converting system of claim 1, wherein the first light source has a dominant wavelength of 420 nm~480 nm.

18. The wavelength converting system of claim 1, wherein the second light source has a dominant wavelength of 420 nm~480 nm.

19. The wavelength converting system of claim 1, wherein the first light source or the second light source can emit a blue light.

20. The wavelength converting system of claim 1, wherein the first mixed light or the second mixed light is a white light.

* * * * *